(12) United States Patent
Chen et al.

(10) Patent No.: US 8,970,318 B2
(45) Date of Patent: Mar. 3, 2015

(54) TRANSFORMING CIRCUIT

(75) Inventors: Shin-Fu Chen, Hsinchu (TW); Ling-Wei Ke, Hsinchu County (TW); Ming-Fong Lei, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 474 days.

(21) Appl. No.: 13/005,542

(22) Filed: Jan. 13, 2011

(65) Prior Publication Data

US 2011/0291768 A1    Dec. 1, 2011

Related U.S. Application Data

(60) Provisional application No. 61/349,255, filed on May 28, 2010.

(51) Int. Cl.
*H03H 5/00* (2006.01)
*H03H 7/42* (2006.01)
*H01F 27/28* (2006.01)

(52) U.S. Cl.
CPC . *H03H 7/42* (2013.01); *H01F 27/28* (2013.01)
USPC .......................................... 333/25; 333/24 R

(58) Field of Classification Search
CPC .................................. H03H 5/00; H03H 7/42
USPC .......... 333/25, 26, 238; 336/84 R, 84 C, 182, 336/200
See application file for complete search history.

(56) References Cited

U.S. PATENT DOCUMENTS

| | | | |
|---|---|---|---|
| 6,882,263 B2 | 4/2005 | Yang | |
| 7,274,913 B2* | 9/2007 | Marholev et al. | 455/78 |
| 7,924,937 B2* | 4/2011 | Norsworthy et al. | 375/295 |
| 7,944,085 B2* | 5/2011 | Kyono | 307/31 |
| 8,270,926 B2* | 9/2012 | Roufoogaran et al. | 455/78 |
| 2004/0037363 A1 | 2/2004 | Norsworthy | |
| 2007/0298731 A1 | 12/2007 | Zolfaghari | |

OTHER PUBLICATIONS

Min, "5-6 GHZ SPDT Switchable Balun Using CMOS Transistors", 2008 IEEE Radio Frequency Integrated Circuits Symposium, p. 321-324, 2008.

Farazian, "A Dual-Band CMOS CDMA Transmitter Without SAW and Driver Amplifier", 2009 IEEE Radio Frequency Integrated Circuits Symposium, p. 523-526, 2009.

* cited by examiner

*Primary Examiner* — Dean Takaoka
(74) *Attorney, Agent, or Firm* — Winston Hsu; Scott Margo

(57) ABSTRACT

A transforming circuit includes: a first winding having a first port and a second port operably coupled for a differential signal; and a plurality of second windings, each having a third port and a fourth port operably coupled for a single-ended signal when magnetically coupled to the first winding. When one of the second windings is magnetically coupled to the first winding, each remaining second winding(s) is not magnetically coupled to the first winding.

17 Claims, 5 Drawing Sheets

TRANSFORMING CIRCUIT

CROSS REFERENCE TO RELATED APPLICATIONS

This application claims the benefit of U.S. Provisional Application No. 61/349,255, which was filed on May 28, 2010 and is included herein by reference.

BACKGROUND

The present invention relates to a transforming circuit, and more particularly to a transforming circuit capable of transforming signals corresponding to different frequency bands.

In a communication system, a transformer balun (balanced/unbalanced) is a device installed in the transmitter and the receiver, and is used to convert single ended signals into differential signals and vice versa. Conventionally, one transformer balun is always designed to convert a signal corresponding to one specific frequency band. In other words, the coupling coefficient has the largest value when the signal is in the specific frequency band, and the coupling coefficient may be worse when the signal is outside the specific frequency band. Accordingly, in a multi-mode communication system, a plurality of transformer baluns is used for converting signals corresponding to different respective modes. As one transformer balun may occupy a relatively large area, installing the plurality of transformer baluns into the multi-mode communication system can cause the manufacturer significant problems. Therefore, providing an efficient and low cost transforming circuit for the multi-mode communication system is a significant concern in this field.

SUMMARY OF THE INVENTION

One of the objectives of the present invention is therefore to provide a transforming circuit capable of transforming signals corresponding to different frequency bands.

According to a first embodiment of the present invention, a transforming circuit is disclosed. The transforming circuit comprises a first winding and a plurality of second windings. The first winding has a first port and a second port operably coupled for a differential signal. Each of the plurality of second windings has a third port and a fourth port operably coupled for a single-ended signal when magnetically coupled to the first winding.

According to a second embodiment of the present invention, a transforming circuit is disclosed. The transforming circuit comprises a first winding, a plurality of second windings, and a plurality of switches. The first winding has a first port and a second port arranged to couple a differential signal. Each of the plurality of second windings has a third port and a fourth port, and each of the fourth ports is arranged to couple a single-ended signal. Each of the plurality of switches is arranged to be selectively coupled between the third port of one of the plurality of second windings and a reference voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections. In addition, as one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

Figure 1:
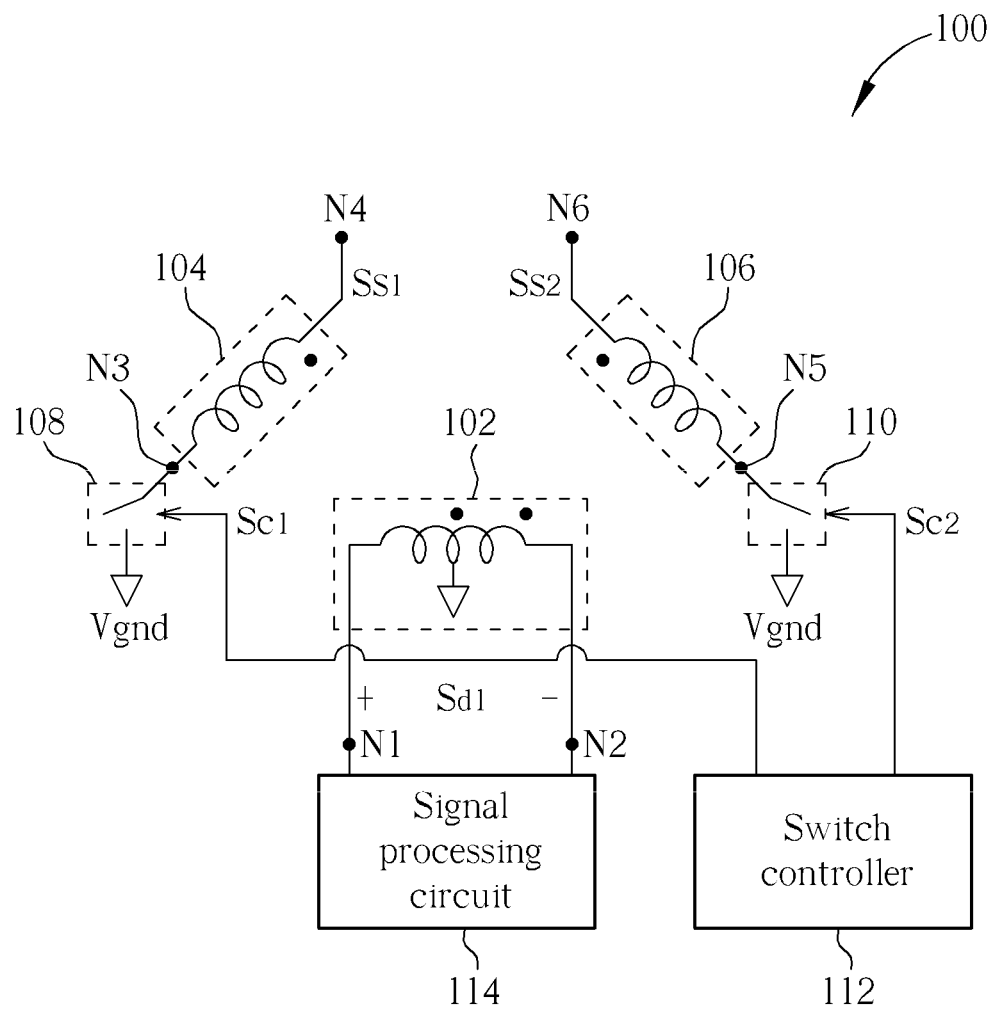
FIG. 1 is a diagram illustrating a transforming circuit according to a first embodiment of the present invention.

Please refer to FIG. 1. FIG. 1 is a diagram illustrating a transforming circuit 100 according to a first embodiment of the present invention. The transforming circuit 100 comprises a primary winding 102, a first secondary winding 104, a second secondary winding 106, a first switch 108, a second switch 110, a switch controller 112, and a signal processing circuit 114. The primary winding 102 has a first port N1 and a second port N2 operably coupled for a differential signal Sd1, which means that the primary winding 102 can be controlled to receive a signal to be the differential signal Sd1 from one of the first secondary winding 104 and the second secondary winding 106, or to transmit a signal (i.e., the differential signal Sd1) to one of the first secondary winding 104 and the second secondary winding 106. The first secondary winding 104 has a third port N3 and a fourth port N4 operably coupled for a first single-ended signal Ss1 when magnetically coupled to the primary winding 102, which means that the first secondary winding 104 can be controlled to receive a wireless signal to be the first single-ended signal Ss1 for magnetically transforming the first single-ended signal Ss1 to the primary winding 102, or to transmit a signal (i.e., the first single-ended signal Ss1) to a follow-up circuit when magnetically coupled to the primary winding 102. The second secondary winding 106 has a fifth port N5 and a sixth port N6 operably coupled for a second single-ended signal Ss2 when magnetically coupled to the primary winding 102, which means that the second secondary winding 106 can be controlled to receive a wireless signal to be the second single-ended signal Ss2 for magnetically transforming the second single-ended signal Ss2 to the primary winding 102, or to transmit a signal (i.e., the second single-ended signal Ss2) to a follow-up circuit when magnetically coupled to the primary winding 102. It should be noted that the first secondary winding 104 is designed to spatially separate from the second secondary winding 106 as they are operated under different modes, i.e., different frequency bands, which means that the space between the first secondary winding 104 and the second secondary winding 106 is occupied by insulating material or other material having similar effect. In addition, the first switch 108 is coupled between the third port N3 of the first secondary winding 104 and a reference voltage (e.g., the ground voltage Vgnd), and the first switch 108 is arranged to selectively disconnect the first secondary winding 104 from the ground voltage Vgnd or connect the first secondary winding 104 to the ground voltage Vgnd. The second switch 110 is coupled between the fifth port N5 of the second secondary winding 106 and the ground voltage Vgnd, the second switch 110 is arranged to selectively disconnect the second secondary winding 106 from the ground voltage Vgnd or connect the second secondary winding 106 to the ground voltage Vgnd. The switch controller 112 is arranged to generate a first control signal Sc1 and a second control signal Sc2 to control the first switch 108 and the second switch 110 respectively. The signal processing circuit 114 is capable of outputting or receiving differential signals corresponding to two different frequency bands to the primary winding 102. More specifically, when the third port N3 of the first secondary winding 104 is coupled to the ground voltage Vgnd, the first secondary winding 104 can be controlled to receive a wireless signal to be the first single-ended signal Ss1 for magnetically transforming the first single-ended signal Ss1 to the primary winding 102, or to transmit a signal (i.e., the first single-ended signal Ss1) to a follow-up circuit when magnetically coupled to the primary winding 102. When the fifth port N5 of the second secondary winding 106 is coupled to the ground voltage Vgnd, the second secondary winding 106 can be controlled to receive a wireless signal to be the second single-ended signal Ss2 for magnetically transforming the second single-ended signal Ss2 to the primary winding 102, or to transmit a signal (i.e., the second single-ended signal Ss2) to a follow-up circuit when magnetically coupled to the primary winding 102.

Furthermore, in this preferred embodiment, the transforming circuit 100 is part of a two-mode transmitter, therefore the transforming circuit 100 is used for transmitting one of the single-ended signals Ss1, Ss2 via the first secondary winding 104 or the second secondary winding 106 in response to the differential signal Sd1, wherein the first single-ended signal Ss1 corresponds to a first frequency band of the first transmitting mode, and the second single-ended signal Ss2 corresponds to a second frequency band of the second transmitting mode.

When the two-mode transmitter is under operation, the signal processing circuit 114, which can be a driver, outputs the differential signal Sd1 corresponding to a specific frequency band, i.e., the first frequency band for example, to the primary winding 102. Meanwhile, the switch controller 112 generates the first control signal Sc1 to connect the third port N3 of the first secondary winding 104 to the ground voltage Vgnd, and generates the second control signal Sc2 to disconnect the second secondary winding 106 from the ground voltage Vgnd. As a result, the first secondary winding 104 is able to magnetically couple the differential signal Sd1 of the primary winding 102 to generate the first single-ended signal Ss1 on the first secondary winding 104. As the transformer balun comprised of the primary winding 102 and the first secondary winding 104 is designed to transmit the signal in the first frequency band signal, the coupling coefficient between the primary winding 102 and the first secondary winding 104 can be adjusted to have the best coupling coefficient by adjusting the inductance of the first secondary winding 104. It should be noted that the fourth port N4 of the first secondary winding 104 can be connected to an antenna, which is used for transmitting the first single-ended signal Ss1. As the second secondary winding 106 is disconnected from the ground voltage Vgnd (i.e., the second secondary winding 106 is an open circuit) when the two-mode transmitter is operated under the first mode, the second secondary winding 106 may not magnetically interfere with the operation of the first secondary winding 104.

Similarly, when the two-mode transmitter is operated under the second mode, the switch controller 112 generates the first control signal Sc1 to disconnect the third port N3 of the first secondary winding 104 from the ground voltage Vgnd, and generates the second control signal Sc2 to connect the second secondary winding 106 to the ground voltage Vgnd. The second secondary winding 106 can then be used to magnetically couple the differential signal Sd1 generated by the primary winding 102 to generate the second single-ended signal Ss2 corresponding to the second frequency band.

According to the above description, the primary winding 102 can be the common primary winding of the first secondary winding 104 and the second secondary winding 106, in which the first secondary winding 104 is responsible for transmitting the signal corresponding to the first frequency band and the second secondary winding 106 is responsible for transmitting the signal corresponding to the second frequency band. Therefore, by using the present transforming circuit 100, a transmitter is capable of transmitting signals of two different frequency bands instead of using two transformer baluns. More specifically, by using the present transforming circuit 100, a two-mode transmitter can save at least one primary winding.

Figure 2:
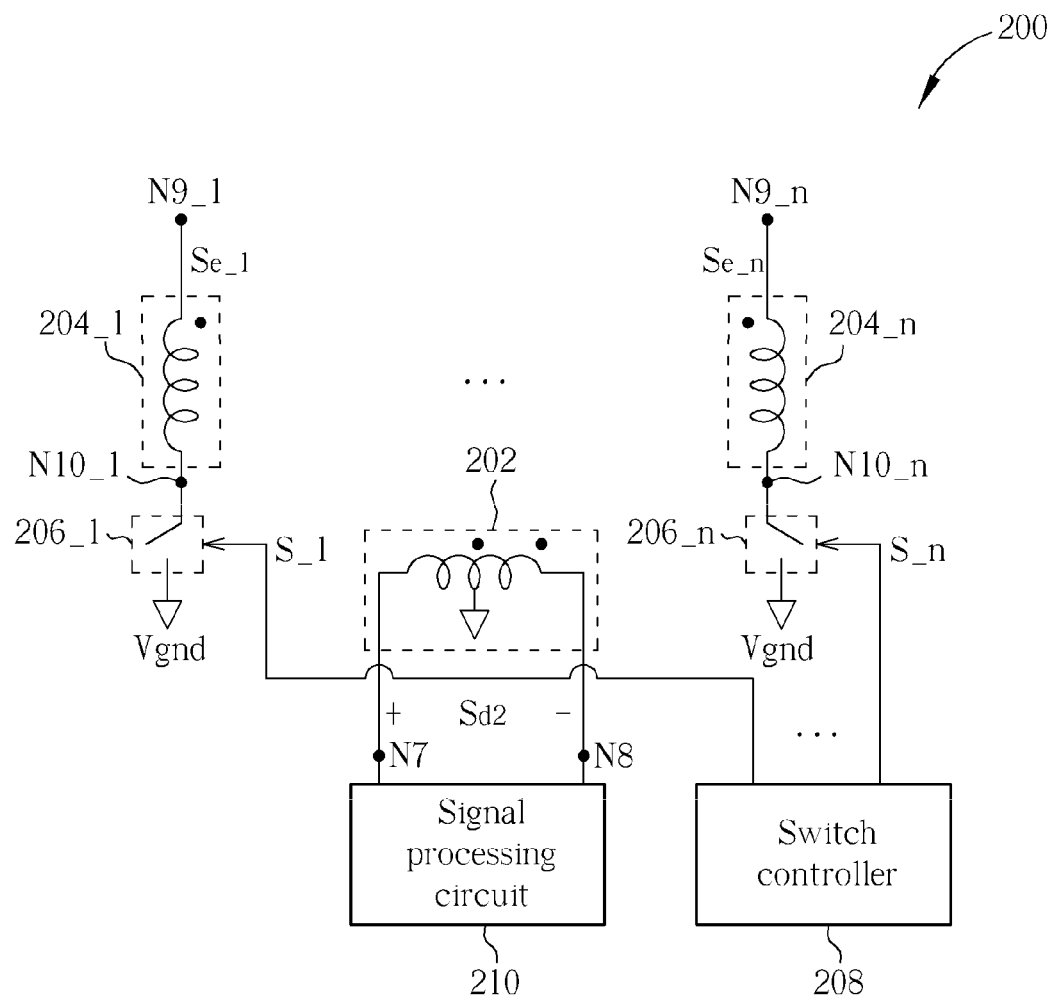
FIG. 2 is a diagram illustrating a transforming circuit according to a second embodiment of the present invention.

It should be noted that the first embodiment is not a limitation of the present invention. The idea disclosed in the first embodiment can also be modified for a multi-mode transmitter, which is used for transmitting differential signals corresponding to a plurality of different frequency bands as shown in FIG. 2. FIG. 2 is a diagram illustrating a transforming circuit 200 according to a second embodiment of the present invention. The transforming circuit 200 comprises a primary winding 202, a plurality of secondary windings 204_1-204_n, a plurality of switches 206_1-206_n, a switch controller 208, and a signal processing circuit 210. The primary winding 202 has a first port N7 and a second port N8 operably coupled for a differential signal Sd2. Each of the plurality of secondary windings 204_1-204_n has a third port (i.e., N9_1-N9_n) and a fourth port (i.e., N10_1-N10_n) operably coupled for a single-ended signal (i.e., Se_1-Se_n) when magnetically coupled to the primary winding 202.

It should be noted that the plurality of secondary windings 204_1-204_n are designed to spatially separate with each other as they are operated under different modes, i.e., different frequency bands, which means that the spaces between the plurality of secondary windings 204_1-204_n are occupied by insulating material or other material having similar effect. In addition, the plurality of switches 206_1-206_n are coupled between the third ports N9_1-N9_n of the plurality of secondary windings 204_1-204_n and a reference voltage (e.g., the ground voltage Vgnd) respectively, in which each switch is arranged to selectively disconnect one secondary winding from the ground voltage Vgnd or connect the secondary winding to the ground voltage Vgnd. The switch controller 208 is arranged to generate a plurality of control signals S_1-S_n for on/off control of the plurality of switches 206_1-206_n respectively. The signal processing circuit 210 is capable of outputting differential signals corresponding to the plurality of different frequency bands to the primary winding 202.

When the multi-mode transmitter is under operation, the signal processing circuit 210 outputs the differential signal Sd2 corresponding to a specific frequency band to the primary winding 202. Meanwhile, the switch controller 208 generates the plurality of control signals S_1-S_n to connect the fourth port of the secondary winding corresponding to the specific frequency band to the ground voltage Vgnd, and disconnect the other secondary windings from the ground voltage Vgnd. As a result, the selected secondary winding is able to magnetically couple the differential signal Sd2 of the primary winding 202 to generate the single-ended signal corresponding to the specific frequency band on the selected secondary winding. As the other non-selected second secondary windings are disconnected from the ground voltage Vgnd when the multi-mode transmitter is operated under the specific mode corresponding to the specific frequency band, the other non-selected second secondary windings may not magnetically interfere with the operation of the selected secondary winding.

Therefore, the primary winding 202 can be the common primary winding of the plurality of secondary windings 204_1-204_n, in which each secondary winding is responsible for transmitting the signal corresponding to one predetermined frequency band. In other words, by using the present transforming circuit 200, a transmitter is capable of transmitting signals of a plurality of different frequency bands instead of using a plurality of respective transformer baluns.

Figure 3:
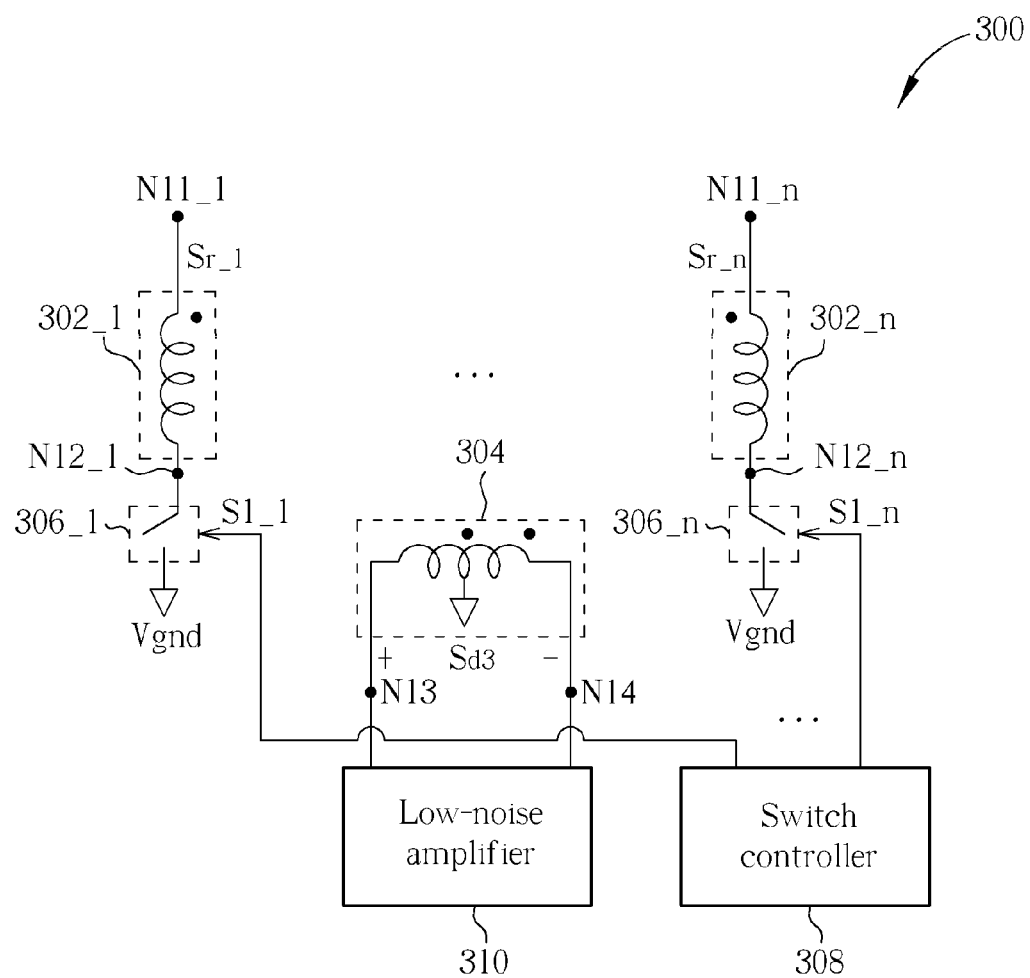
FIG. 3 is a diagram illustrating a transforming circuit according to a third embodiment of the present invention.

In addition, according to the ideas disclosed in the above preferred embodiments, the transforming circuit 100 and the transforming circuit 200 can also be modified for a receiver. For example, when the transforming circuit 200 is modified for a multi-mode receiver, the signal processing circuit 210 can be replaced by a low-noise amplifier (LNA), in which the low-noise amplifier is capable of amplifying a plurality of differential signals corresponding to a plurality of different frequency bands received from a plurality of primary windings respectively as shown in FIG. 3. FIG. 3 is a transforming circuit 300 according to a third embodiment of the present invention. The transforming circuit 300 comprises a plurality of primary windings 302_1-302_n, a secondary winding 304, a plurality of switches 306_1-306_n, a switch controller 308, and a low-noise amplifier (LNA) 310. Each of the plurality of primary windings 302_1-302_n has a first port (i.e., N11_1-N11_n) and a second port (i.e., N12_1-N12_n) operably coupled for a single-ended signal (i.e., Sr_1-Sr_n). The secondary winding 304 has a third port N13 and a fourth port N14 operably coupled for a differential signal Sd3 when magnetically coupled to one of the primary windings 302_1-302_n. As the transforming circuit 300 is a part of the multi-mode receiver, a plurality of antennas (not shown) are coupled to the plurality of first ports N11_1-N11_n of the plurality of primary windings 302_1-302_n respectively.

When the multi-mode receiver is under operation, the plurality of antennas is able to receive a plurality of wireless signals corresponding to different respective frequency bands. To select one of the wireless signals corresponding to a specific frequency band as the input signal of the multi-mode receiver, the switch controller 310 generates the plurality of control signals S1_1-S1_n to connect the first port of the primary winding corresponding to the specific frequency band to the ground voltage Vgnd, and disconnect the other primary windings from the ground voltage Vgnd. As a result, the secondary winding 304 is able to magnetically couple the single-ended signal of the selected primary winding to generate the differential signal corresponding to the specific frequency band on the secondary winding 304. As the other non-selected primary windings are disconnected from the ground voltage Vgnd when the multi-mode receiver is operated under the specific mode corresponding to the specific frequency band, the other non-selected primary windings may not magnetically interfere with the operation of the secondary winding 304.

Therefore, the secondary winding 304 can be the common secondary winding of the plurality of primary windings 302_1-302_n, in which each primary winding is responsible for receiving the signal corresponding to one predetermined frequency band. In other words, by using the present transforming circuit 300, a receiver is capable of receiving signals of a plurality of different frequency bands instead of using a plurality of respective transformer baluns.

Figure 4:
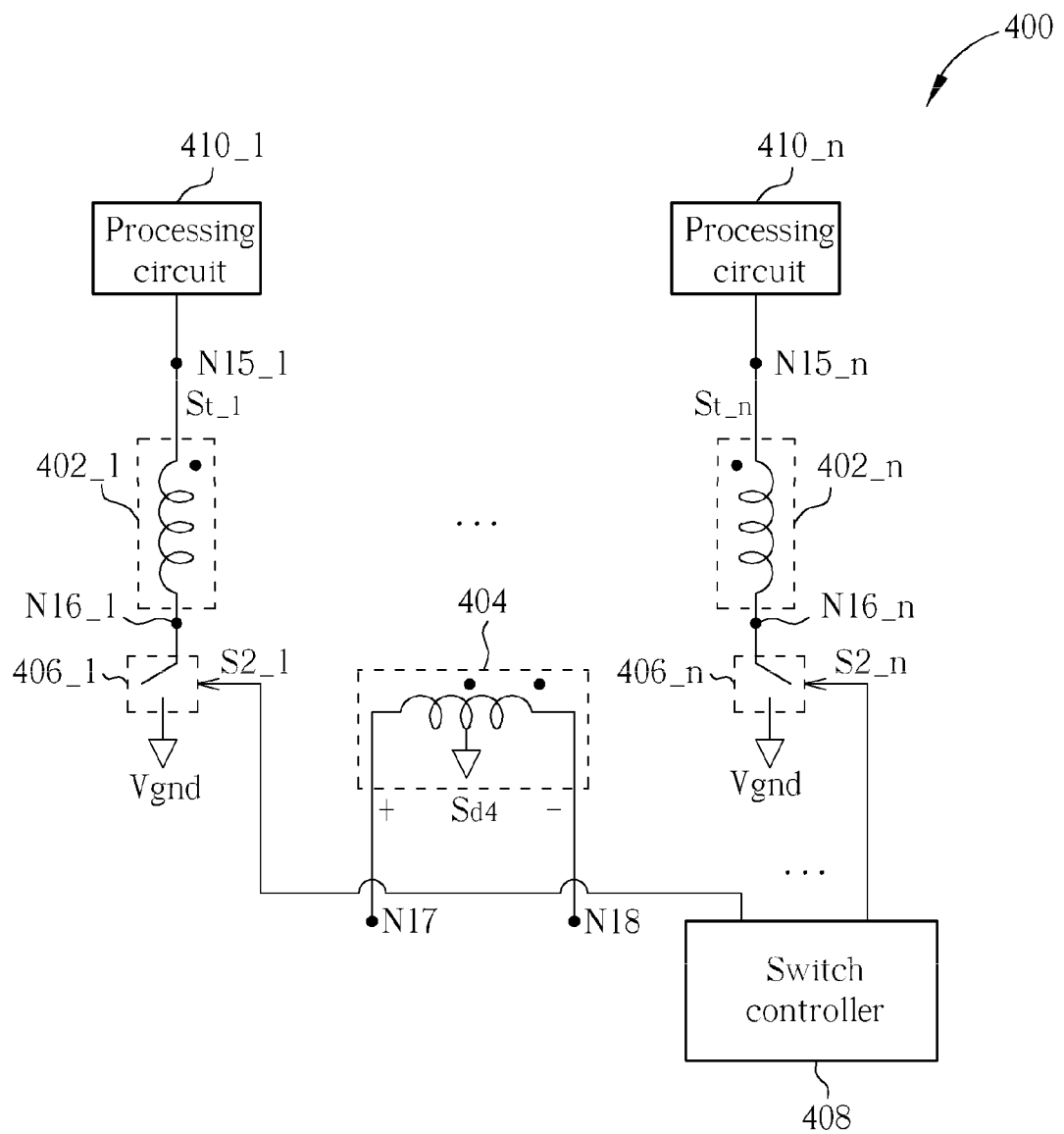
FIG. 4 is a diagram illustrating a transforming circuit according to a fourth embodiment of the present invention.

In addition, according to the ideas disclosed in the above preferred embodiments, the transforming circuit 100 and the transforming circuit 200 can also be modified for a multi-mode transmitter, in which the plurality of primary windings are responsible for generating a plurality of single-ended signals corresponding to a plurality of frequency bands from a plurality of drivers respectively, and the secondary winding is responsible for magnetically coupling one of the plurality of primary windings to generate a differential signal as shown in FIG. 4. FIG. 4 is a transforming circuit 400 according to a fourth embodiment of the present invention. The transforming circuit 400 comprises a plurality of primary windings 402_1-402_n, a secondary winding 404, a plurality of switches 406_1-406_n, a switch controller 408, and a plurality of processing circuits 410_1-410_n. For example, the processing circuits 410_1-410_n can be power amplifiers or signal drivers. Each of the plurality of primary windings 410_1-410_n has a first port (i.e., N15_1-N15_n) and a second port (i.e., N16_1-N16_n) operably coupled for a single-ended signal (i.e., St_1-St_n). The secondary winding 404 has a third port N17 and a fourth port N18 operably coupled for a differential signal Sd4 when magnetically coupled to one of the primary windings 402_1-402_n. As the transforming circuit 400 is a part of the multi-mode transmitter, a plurality of drivers are coupled to the plurality of first ports N15_1-N15_n of the plurality of primary windings 402_1-402_n respectively, and an antenna (not shown) is coupled to the third port N17 and the fourth port N18 of the secondary winding 404.

The transforming circuit 400 is used to transmit the differential signal Sd4 in response to one of the single-ended signals St_1-St_n. Therefore, when the multi-mode transmitter is under operation, the plurality of drivers 410_1-410_n are able to generate a plurality of single-ended signals corresponding to different frequency bands respectively, and the secondary winding 404 magnetically couples one of the plurality of single-ended signals to generate the differential signal Sd4 to the antenna. To select one of the single-ended signals corresponding to a specific frequency band as the transmitted signal of the multi-mode transmitter, the switch controller 408 generates the plurality of control signals S2_1-S2_n to connect the first port of one of the primary winding 402_1-402_n corresponding to the specific frequency band to the ground voltage Vgnd, and disconnect the other primary windings from the ground voltage Vgnd. As a result, the secondary winding 404 is able to magnetically couple the single-ended signal of the selected primary winding to generate the differential signal corresponding to the specific frequency band on the secondary winding 404. As the other non-selected primary windings are disconnected from the ground voltage Vgnd when the multi-mode transmitter is operated under the specific mode corresponding to the specific frequency band, the other non-selected primary windings may not magnetically interfere with the operation of the secondary winding 404.

Therefore, the secondary winding 404 can be the common secondary winding of the plurality of primary windings 402_1-402_n, in which each primary winding is responsible for generating the single-ended signal corresponding to one predetermined frequency band. In other words, by using the present transforming circuit 400, a transmitter is capable of transmitting signals of a plurality of different frequency bands instead of using a plurality of respective transformer baluns.

Figure 5:
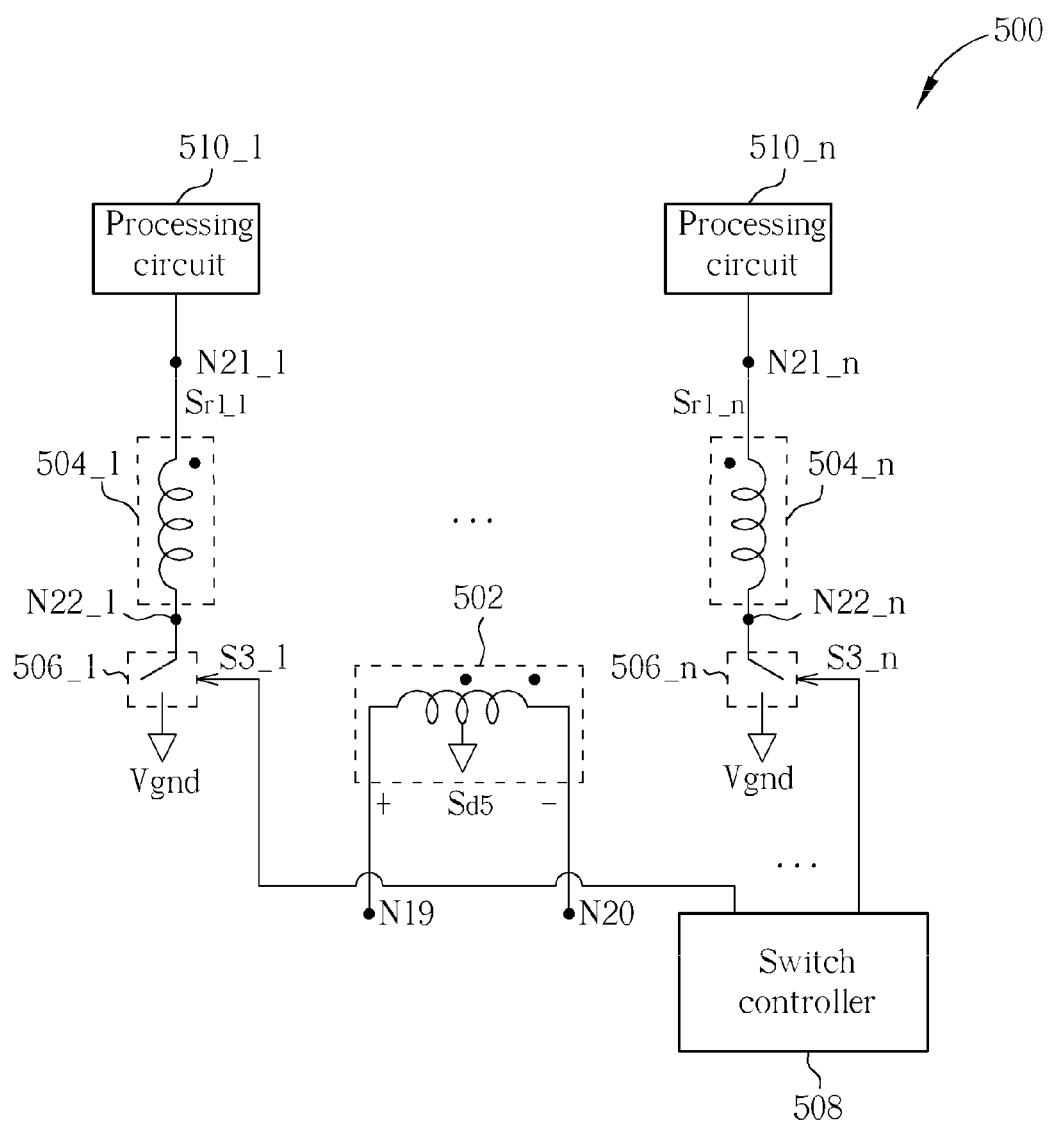
FIG. 5 is a diagram illustrating a transforming circuit according to a fifth embodiment of the present invention.

In addition, according to the ideas disclosed in the above preferred embodiments, the transforming circuit 100 and the transforming circuit 200 can also be modified for a multi-mode receiver, in which the primary winding is responsible for receiving differential wireless signals corresponding to a plurality of frequency bands, and one of the plurality of secondary windings is responsible for magnetically coupling the primary winding to generate a single-ended signal as shown in FIG. 5. FIG. 5 is a transforming circuit 500 according to a fifth embodiment of the present invention. The transforming circuit 500 comprises a primary winding 502, a plurality of secondary windings 504_1-504_n, a plurality of switches 506_1-506_n, a switch controller 508, and a plurality of processing circuits 510_1-510_n. The primary winding 502 has a third port N19 and a fourth port N20 operably coupled for a differential signal Sd5. Each of the plurality of secondary windings 504_1-504_n has a first port (i.e., N21_1-N21_n) and a second port (i.e., N22_1-N22_n) operably coupled for a single-ended signal (i.e., Sr1_1-Sr1_n) when magnetically coupled to the primary winding 502. As the transforming circuit 500 is a part of the multi-mode receiver, the plurality of low-noise amplifiers are coupled to the plurality of first ports N21_1-N21_n of the plurality of secondary windings 504_1-504_n respectively, and an antenna (not shown) is coupled to the third port N19 and the fourth port N20 of the primary winding 502.

The transforming circuit 500 is used to receive one of the plurality of single-ended signals Sr1_1-Sr1_n in response to the differential signal Sd5. Therefore, when the multi-mode receiver is under operation, the antenna coupled to the primary winding 502 is able to receive a plurality of differential signals corresponding to different frequency bands, and one of the secondary windings 504_1-504_n magnetically couples the differential signals corresponding to a specific frequency band to generate a single-ended signal to the respective low-noise amplifier. To select one of the single-ended signals corresponding to a specific frequency band as the received signal of the multi-mode receiver, the switch controller 508 generates the plurality of control signals S3_1-S3_n to connect the first port of one of the secondary windings 504_1-504_n corresponding to the specific frequency band to the ground voltage Vgnd, and disconnect the other secondary windings from the ground voltage Vgnd. As a result, the selected secondary winding is able to magnetically couple the differential signals of the primary winding 502 to generate the single-ended signal corresponding to the specific frequency band on the selected secondary winding. As the other non-selected secondary windings are disconnected from the ground voltage Vgnd when the multi-mode receiver is operated under the specific mode corresponding to the specific frequency band, the other non-selected secondary windings may not magnetically interfere with the operation of the selected secondary winding.

Therefore, the primary winding 502 can be the common primary winding of the plurality of secondary windings 504_1-504_n, in which each secondary winding is responsible for generating the single-ended signal corresponding to one predetermined frequency band. In other words, by using the present transforming circuit 500, a receiver is capable of receiving signals of a plurality of different frequency bands instead of using a plurality of respective transformer baluns.

Briefly, by using the above mentioned transforming circuits, a transmitter (or a receiver) is capable of transmitting (or receiving) a plurality of signals corresponding to different frequency bands instead of using a plurality of respective transformer baluns. In other words, by setting one winding as the common primary winding of a plurality of secondary windings, or vice versa, the present embodiments save the cost of installing a plurality of transformer baluns in the communication system when dealing with signals corresponding to a plurality of frequency bands.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transforming circuit, comprising:
a first winding, having a first port and a second port operably coupled for a differential signal; and
a plurality of second windings, each having a third port and a fourth port operably coupled for a single-ended signal when magnetically coupled to the first winding;
wherein when one of the second windings is magnetically coupled to the first winding, each of the remaining second winding(s) is not magnetically coupled to the first winding.

2. The transforming circuit of claim 1, wherein when the first winding is a primary winding and the plurality of second windings is a plurality of secondary windings respectively, the transforming circuit is part of a transmitter arranged to transmit the single-ended signal in response to the differential signal.

3. A transforming circuit, comprising:
a first winding, having a first port and a second port operably coupled for a differential signal; and
a plurality of second windings, each having a third port and a fourth port operably coupled for a single-ended signal when magnetically coupled to the first winding;
wherein when the plurality of second windings is a plurality of primary windings respectively and the first winding is a secondary winding, the transforming circuit is part of a receiver arranged to receive the differential signal in response to the single-ended signal.

4. A transforming circuit, comprising:
a first winding, having a first port and a second port operably coupled for a differential signal; and
a plurality of second windings, each having a third port and a fourth port operably coupled for a single-ended signal when magnetically coupled to the first winding;
wherein when the plurality of second windings is a plurality of primary windings respectively and the first winding is a secondary winding, the transforming circuit is part of a transmitter arranged to transmit the differential signal in response to the single-ended signal.

5. A transforming circuit, comprising:
a first winding, having a first port and a second port operably coupled for a differential signal; and a plurality of second windings, each having a third port and a fourth port operably coupled for a single-ended signal when magnetically coupled to the first winding;

wherein when the first winding is a primary winding and the plurality of second windings is a plurality of secondary windings respectively, the transforming circuit is part of a receiver arranged to receive the single-ended signal in response to the differential signal.

6. A transforming circuit, comprising:

a first winding, having a first port and a second port operably coupled for a differential signal;

a plurality of second windings, each having a third port and a fourth port operably coupled for a single-ended signal when magnetically coupled to the first winding; and a plurality of switches, coupled between third ports of the plurality of second windings and a plurality of reference voltages respectively, wherein each of the plurality of switches is arranged to selectively connect a corresponding second winding to one of the reference voltages or not.

7. The transforming circuit of claim 6, further comprising:

a switch controller, arranged to control the plurality of switches respectively;

wherein the plurality of second windings are arranged to correspond to a plurality of frequency bands respectively, and when a specific single-ended signal corresponding to a specific frequency band is to be coupled to a specific second winding, the switch controller generates a plurality of control signals to connect the specific second winding to one of the reference voltages and disconnect the second windings other than the specific second winding from the reference voltages.

8. A transforming circuit, comprising:

a first winding, having a first port and a second port operably coupled for a differential signal; and a plurality of second windings, each having a third port and a fourth port operably coupled for a single-ended signal when magnetically coupled to the first winding;

wherein the plurality of second windings have different inductances.

9. The transforming circuit of claim 8, wherein the plurality of second windings are spatially separated from each other.

10. A transforming circuit, comprising:

a first winding, having a first port and a second port arranged to couple a differential signal;

a plurality of second windings, each having a third port and a fourth port, wherein each of the fourth ports is arranged to couple a single-ended signal; and a plurality of switches, each arranged to be selectively coupled between the third port of one of the plurality of second windings and a reference voltage;

wherein when one of the second windings is magnetically coupled to the first winding, each of the remaining second winding(s) is not magnetically coupled to the first winding.

11. The transforming circuit of claim 10, further comprising:

a switch controller, arranged to control the plurality of switches respectively;

wherein the plurality of second windings are arranged to correspond to a plurality of frequency bands respectively, and when a specific single-ended signal corresponding to a specific frequency band is to be coupled to a specific second winding, the switch controller generates a plurality of control signals to connect the specific second winding to the reference voltage and disconnect the second windings other than the specific second winding from the reference voltage.

12. The transforming circuit of claim 10, wherein when the first winding is a primary winding and the plurality of second windings is a plurality of secondary windings respectively, the transforming circuit is part of a transmitter arranged to transmit the single-ended signal in response to the differential signal.

13. The transforming circuit of claim 10, wherein when the plurality of second windings is a plurality of primary windings respectively and the first winding is a secondary winding, the transforming circuit is part of a receiver arranged to receive the differential signal in response to the single-ended signal.

14. The transforming circuit of claim 10, wherein when the plurality of second windings is a plurality of primary windings respectively and the first winding is a secondary winding, the transforming circuit is part of a transmitter arranged to transmit the differential signal in response to the single-ended signal.

15. The transforming circuit of claim 10, wherein when the first winding is a primary winding and the plurality of second windings is a plurality of secondary windings respectively, the transforming circuit is part of a receiver arranged to receive the single-ended signal in response to the differential signal.

16. The transforming circuit of claim 10, wherein the plurality of second windings have different inductances.

17. The transforming circuit of claim 10, wherein the plurality of second windings are spatially separated from each other.

* * * * *